United States Patent [19]
Diodato

[11] Patent Number: 5,063,578
[45] Date of Patent: Nov. 5, 1991

[54] DIGITAL LOGIC CIRCUITS FOR FREQUENCY MULTIPLICATION

[75] Inventor: Philip W. Diodato, Asbury, N.J.
[73] Assignee: AT&T Bell Laboratories, Murray Hill, N.J.
[21] Appl. No.: 586,659
[22] Filed: Sep. 24, 1990
[51] Int. Cl.$^5$ ............... H03K 21/08; H03K 23/00; H03B 19/00
[52] U.S. Cl. ................... 377/47; 377/76; 377/118
[58] Field of Search ............ 377/47, 70, 75, 76, 377/118

[56] References Cited

U.S. PATENT DOCUMENTS

| | | | |
|---|---|---|---|
| 4,011,516 | 3/1977 | Heimbigner et al. | 377/47 |
| 4,350,952 | 9/1982 | Holt et al. | 377/47 |
| 4,780,896 | 10/1988 | Dotter | 377/47 |
| 4,876,704 | 10/1989 | Uzaki | 377/75 |

OTHER PUBLICATIONS

Gutierrez, G. et al., "An Integrated PLL Clock Generator for 275 MHz Graphic Displays", *IEEE 1990 Custom Integrated Circuits Conference*, pp. 15.1.1–15.1.3 (1990).

*Primary Examiner*—John S. Heyman
*Attorney, Agent, or Firm*—David I. Caplan

[57] ABSTRACT

A digital logic circuit (100) is provided for multiplying, such as doubling, the frequency of an input clock pulse sequence of period T. The circuit in one embodiment includes complementarily clocked first and second chains of cascaded delay elements (12, 13 in A1, A2, A3, ... and B1, B2, B3, ... ). Further, the n'th one of set of clocked latches (14, 15, 16 in A2, A4, A6, ... ) derives its input from the 2n'th one of the delay elements in the first chain, where n is a running integer index (n=1,2,3, ... ). The circuit (100) also includes a set of two-input logic gates (11), one of whose inputs (IN) is the output (OU) of a separate one of the logic elements (12, 13) in the second chain and the other of whose inputs is an output (MO) of a separate one of the latches (14, 15, 16). Each of the outputs of these logic gates (11) is fed to a multiple input output logic gate (25) whose output has a desired double-frequency feature (edges at T/4) relative to the frequency of the clocked pulse sequence (CLK).

20 Claims, 5 Drawing Sheets

DIGITAL LOGIC CIRCUITS FOR FREQUENCY MULTIPLICATION

TECHNICAL FIELD

This invention relates to digital logic circuits and more particularly to frequency multiplier circuits.

BACKGROUND OF THE INVENTION

Frequency multiplier circuits, such as frequency doubler circuits, are useful for multiplying the frequency of an input signal. Such circuits are useful, for example, for modifying the frequency of an input sequence of pulses (clock pulse sequence) which is used to control the ON vs. OFF timing (control timing) of various transistors in an integrated circuit.

Among the kinds of multiplying circuits in the prior art are analog or digital circuits containing phase-locked loops. However, in order to achieve high accuracy of frequency multiplication, the phase-locked loop circuit approach requires signal stability which, in turn results in relatively long circuit settling times—viz., many periods of the input (clock) signal after its commencement until the output becomes a steady and accurate representation of the desired output signal. Thus, this approach wastes valuable time when the input signal initially is applied to the circuit. In addition, because of these long settling times, the phase-locked loop approach requires the use of relatively high capacitance and/or resistance elements which cannot easily if at all be fabricated as an integrated part of an integrated circuit at the surface of a semiconductor body ("chip"). Instead, these elements must ordinarily be formed external to the chip—that is to say, forming a so-called "hybrid" integrated circuit. Such a hybrid circuit is described, for example, in the paper "An Integrated PLL Clock Generator for 275 MHz Graphic Displays" by G. Gutierrez et al published in *IEEE* 1990 *Custom Integrated Circuits Conference*, pp. 15.1.1–15.1.4 (1990). The circuit described in detail in that paper utilized two external resistors and two external capacitors.

It would therefore be desirable to have a frequency multiplier circuit which does not have such long settling times and does not require any external resistors or capacitors or other external components, in order to reduce circuit costs and complexity.

SUMMARY OF THE INVENTION

A frequency multiplier circuit arrangement, which can be integrated in a single semiconductor chip without the need for any external components and which has a settling time of no more than a period of the input clock pulse signal, is fabricated in accordance with the invention in the form of a digital logic circuit. The settling time is no longer than one period of the input (clock) signal. More specifically, a frequency multiplier circuit arrangement in accordance with the invention comprises:

(a) a first cascaded chain (A1 A2 A3 . . . ) of clocked delay elements (12, 13), each delay element having an intermediate node (R) and an output terminal (OU), and each having essentially the same time delay d in response to a change in an input applied thereto;

(b) a first set of clocked latches (14, 15, 16 in e.g., A2, A4, A6, . . . ) the node (R) of the ni'th one of the clocked delay elements in the first chain (A1 A2 A3 . . . ) being connected to an input terminal of the n'th one of the clocked latches (14, 15, 16 in e.g., A2, A4, A6, . . . ) where n is a running integer and i is a fixed integer;

(c) a second cascaded chain (B1 B2 B3 . . . ) of clocked delay elements (12, 13), each having an intermediate node (R) and an output terminal (OU) and having the same time delay d in response to a change in an input applied thereto;

(d) a first set of logic gates (11 in B1, B2, B3, . . . ), the nk'th one of each having one input terminal (MI) thereof connected to an output terminal (MO) of the n'th one of the clocked latches in the first set of latches (14, 15, 16 in e.g., A2, A4, A6, . . . ), and the n'th one of each having another input terminal connected to the output terminal (OU) of the (n−1)'th one of the clocked delay elements (12 and 13 in B1 B2 B3 . . . ) in the second cascaded chain;

(e) a first multiple input logic gate (25); and (f) means for connecting an output terminal of each of the logic gates (11) in the first set thereof to a separate one of the input terminals of the multiple input logic gate (25).

BRIEF DESCRIPTION OF THE DRAWING(S)

This invention, together with its features, characteristics, and advantages, may be better understood from the following detailed description when read in conjunction with the drawings in which FIG. 1 is a logic diagram of a frequency doubler circuit arrangement, in accordance with a specific embodiment of the invention;

Elements in different FIGURES which are essentially identical are denoted by the same reference labels.

DETAILED DESCRIPTION

Figure 1:
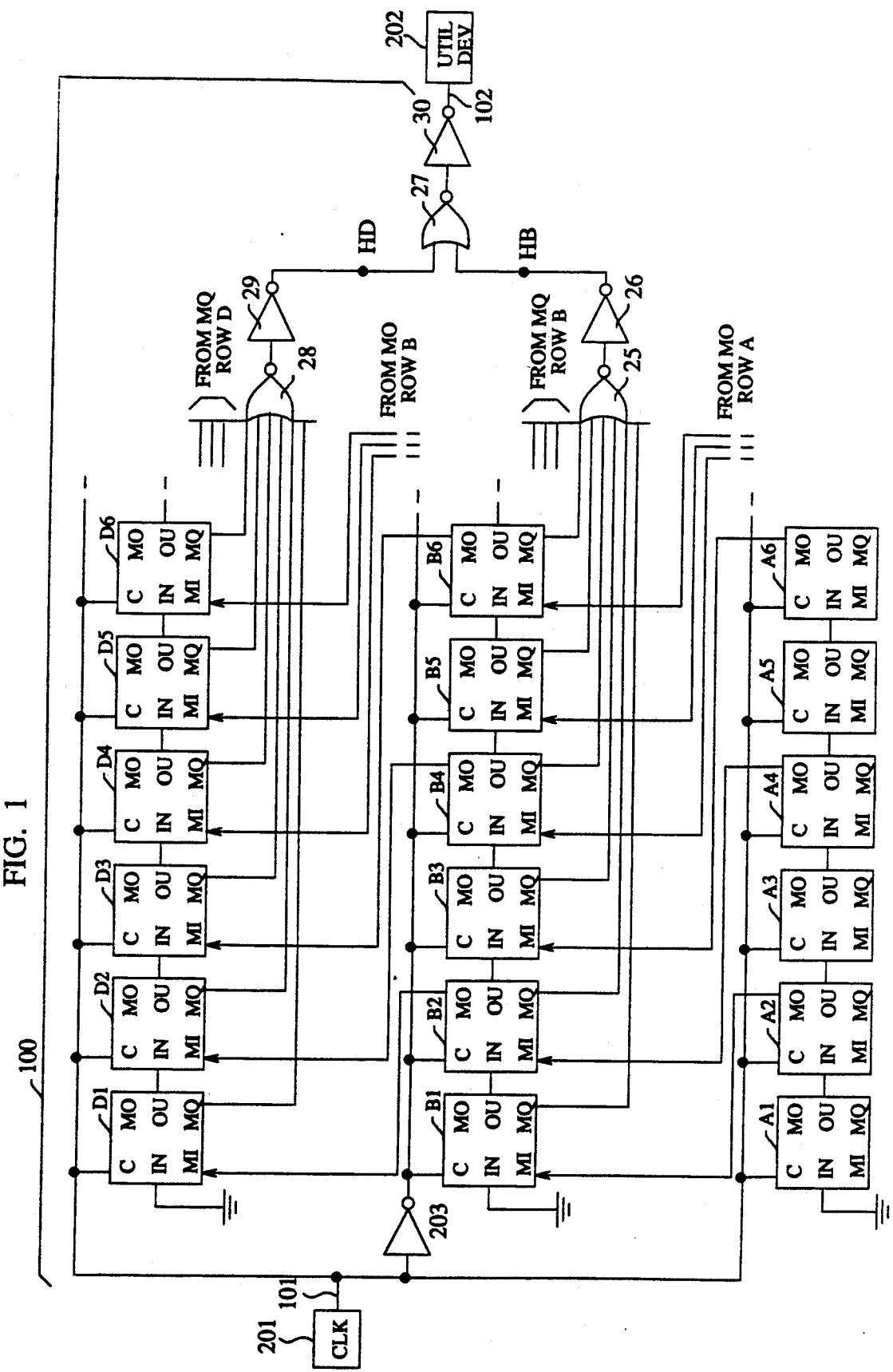

Referring to the drawings, FIG. 1 shows a frequency doubler circuit 100 in digital logic having an input terminal 101 and an output terminal 102. A clock source 201 is connected to and feeds the input terminal 101 with a sequence of (clocked) pulses, each of the pulses having a pulse width of T/2, and having its trailing edge separated from the rising edge of the immediately succeeding pulse by T/2. Thus $f = 1/T$ is the frequency to be doubled by the circuit 100. That is, at the output terminal 102 an output sequence of pulses is to be developed, each of the pulses having a pulse width of T/4 and having its trailing edge separated from the rising edge of the immediately succeeding pulse by T/4. That is, the frequency of the output sequence is $1/(T/2) = 2f$. The output terminal 102 of the circuit 100 feeds a utilization means or device 202 with this output sequence of pulses. The circuit 100 is advantageously integrated on a major surface of a semiconductor chip, this circuit being composed of interconnected NOR gates and INVERTER gates, both of which can easily be integrated in silicon technology, such as in complementary metal oxide semiconductor (CMOS) technology. Typically also, the utilization means 202, as well as the clock source 201, is an integrated circuit which may or may not be integrated in the same semiconductor chip as the circuit 100.

Note that the circuit 100 contains three rows (A, B, D) of cascaded circuit boxes labeled A1, A2, A3, . . . ; B1, B2, B3, . . . ; and D1, D2, D3, . . . . Each of these boxes is substantially identical and is shown in detail in FIG. 2 as a network 10. Note also that some of the terminals of some of the boxes are not connected to anything and thus certain parts of these boxes can be omitted. Nevertheless, for ease of fabrication, and for advantageous equalization of electrical loading during operation, it can be desirable to fabricate all boxes completely.

Figure 2:
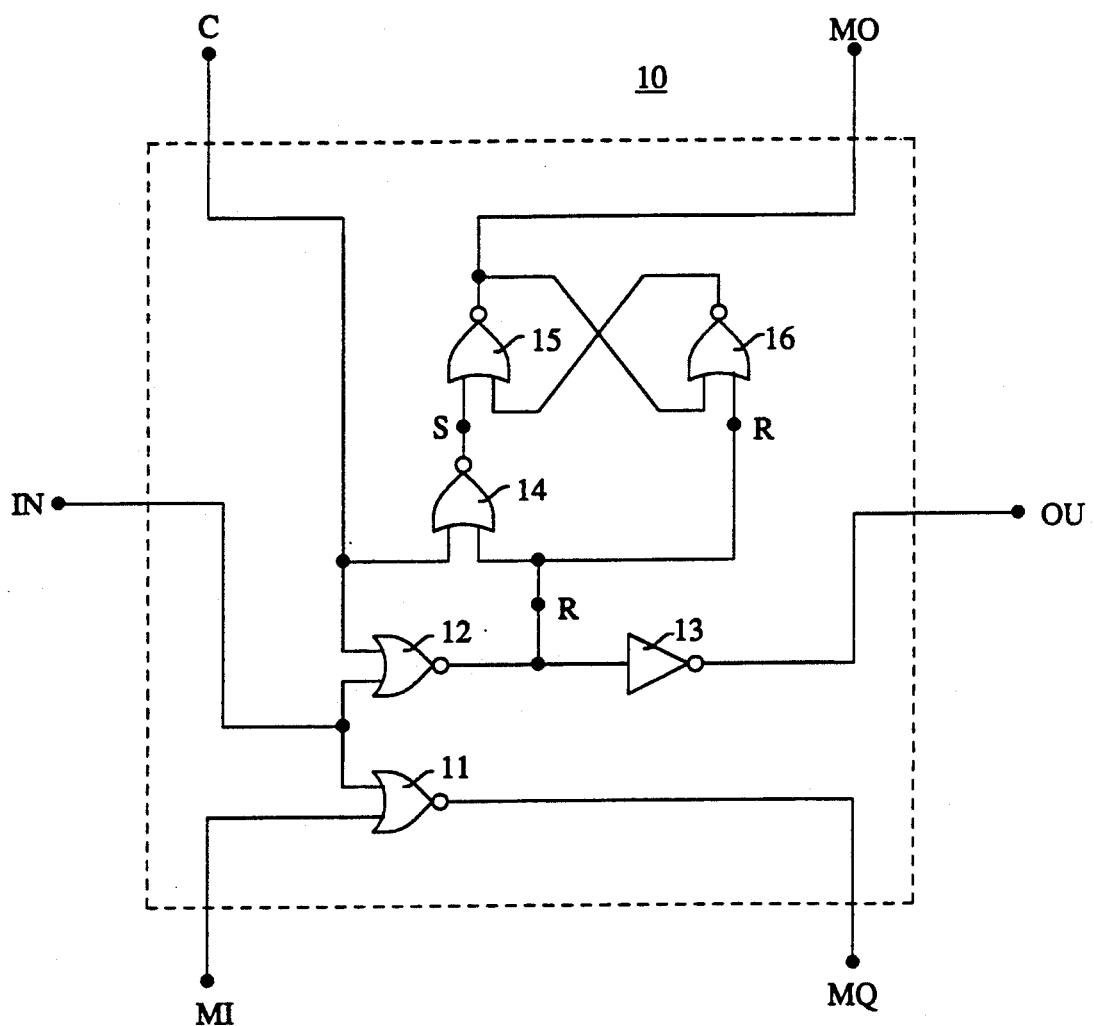
FIG. 2 is a logic diagram showing the logic network that is contained in each square box shown in FIG. 1.

Referring now to FIG. 2, each such network 10 has six terminals: C ("Clock"), MO ("Mark Out"), OU ("Output"), MQ ("Mark Qualified"), MI ("Mark In"), and IN ("Input"). Terminal C is to be connected to a clock pulse sequence; terminal IN is to be connected to terminal OU of the immediately preceding network; and terminals MI, MO, and MQ are to be connected (if at all, for a particular one of the boxes) as described below. The network 10 contains binary output NOR gates 11, 12, 14, 15, and 16, together with a binary output inverter 13—all interconnected as shown.

It may be noted that the NOR gates 15 and 16 are cross-coupled, to form the equivalent of a flip-flop having inputs S an R.

One of the essential features of the network 10 is a response time delay d ("gate delay") in the switching from one output to another of NOR gate 12 in response to a change in one of the inputs. Each of the other NOR gates also have this time delay ("gate delay") because they are all manufactured simultaneously and in the same way. The inverter 13 also has an associated gate delay, but this delay can and will be neglected in describing the operation of the network, as can delays in all other inverters—an inverter having less delay than a NOR gate owing to a NOR gate's having at least two, instead of one, input (pull-down) transistors and hence having more parasitic capacitance than an inverter, all other things being equal.

Figure 3:
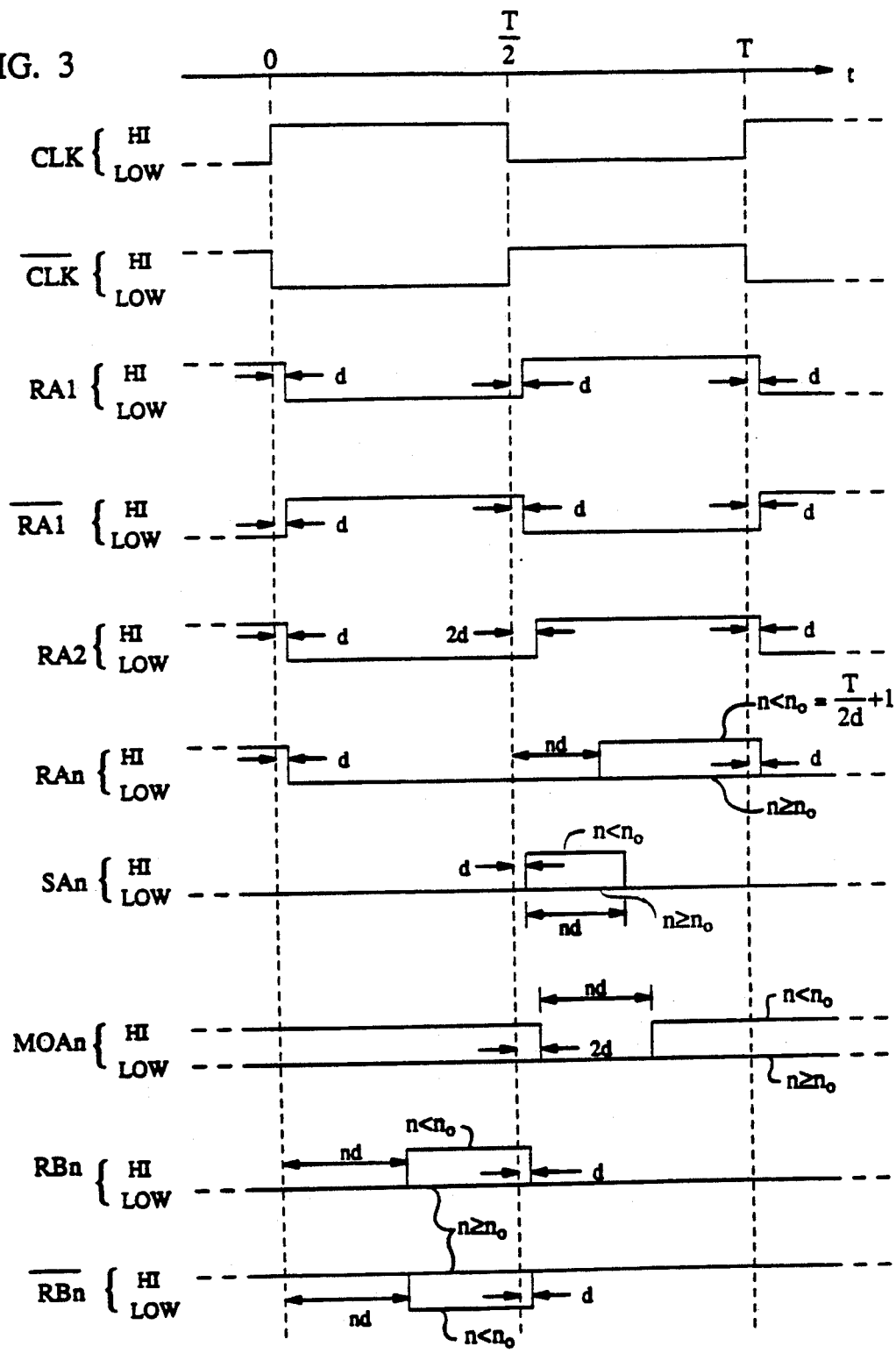
FIGS. 3 and 4 are logic signal timing diagrams, useful in explaining the operation of the arrangement shown in FIG. 1.

Referring now to FIG. 3, in the A row the time profiles of the signals R, S, and MO in the n'th box An are respectively denoted by RAn, SAn and MOAn. Because all boxes in the D row are fed the same clock pulse sequence CLK 101, the profiles in the D row of signals RDn, SDn, and MODn, respectively, will be the same as those of RAn, SAn, and MOAn. On the other hand, because all the boxes in the B row are fed the complementary clock sequence $\overline{\text{CLK}}$ through inverter 203, the profiles of RBn, SBn, and MOBn, respectively, for each n will be complementary to (T/2 out of phase with) those of RAn, SBn, and MOBn.

The CLK sequence 101 during each period of duration T has a binary value of "1" (HI) during the first half of the period—e.g., from time $t=0$ to $t=T/2$—and has a binary value of "0" (LOW) during the second half of the period. In row A, RAn denotes the signal R in the n'th box. The signal RA1 is the inverse of that of the clock CLK delayed at both its rising and falling edges by the amount d, since RA1 is the output of a NOR gate 12 (FIG. 2) one of whose inputs is CLK and the other of whose inputs is ground (LOW). By virtue of inverter 13 (FIG. 2), the inverse of RA1—to wit, $\overline{\text{RA1}}$—is fed to the terminal OU of box A1 and to the terminal IN of box A2.

Just prior to $t=0$, CLK=RA1=0; therefore, just prior to $t=0$, RA2=1. At $t=0$, the clock signal CLK jumps up to HI; therefore, regardless of RA1, RA2 jumps down to LOW a gate delay d thereafter, and RA2 remains LOW until forced to jump back to HI by the return of both CLK and RA1 back to LOW—i.e., a gate delay d after RA1 has returned to LOW (at $t=T/2+d$). At this time—to wit, $t=T/2+2d$—RA2 jumps back up to HI. Similarly, for all n, RAn jump down to LOW at $t=d$ and up to HI at time $t=T/2+nd$. Obviously, however, for large enough n—to wit, $n \geq (T/2d+1)$, RAn=0 for all t, because of the fact that for such large n there is no room (between T/2 and T) for a rising edge of RAn. For convenience, the quantity $T/2d+1$ will be denoted by $n_o=(T/2d)+1$, with the understanding that in case (T/2d) is not an integer, the next highest integer above $T/2d+1$ is intended.

Turning to MOAn and SAn for $n \geq n_o$, since for such large n, RAn=0 for all t, it follows that the flip-flop formed by cross-coupled NOR gates 15 and 16 in box An will settle after circuit operation prior to $t=0$ for at most one period T of the clock CLK to a permanent condition in which SAn=1 for all t and MOAn=0 for all t—as indicated in FIG. 3.

Turning to SAn for $n < n_o$, after circuit operation prior to $t=0$ for at most one period T, SAn=0 from $t=0$ until $t=T/2+d$, at which time SAn=1, that is, a gate delay after CLK has jumped to LOW, RAn having been LOW for some time earlier. A gate delay after RAn jumps to HI—to wit, at $T/2+(n+1)d$—SAn jumps back to LOW. As for MOAn for $n<n_o$, because RAn=1 from $t=0$ until $t=d$, and SAn=0 from $t=0$ until $t=T/2+d$, MOAn will be HI from $t=0$ until a gate delay after SAn goes HI—that is, MOAn will remain HI until $T/2+2d$, at which time MOAn jumps to LOW. Thereafter MOAn will remain LOW until a gate delay after SAn jumps to LOW; that is, MOAn will jump back to HI at $T/2+(n+2)d$—all as indicated in FIG. 3.

Figure 4:
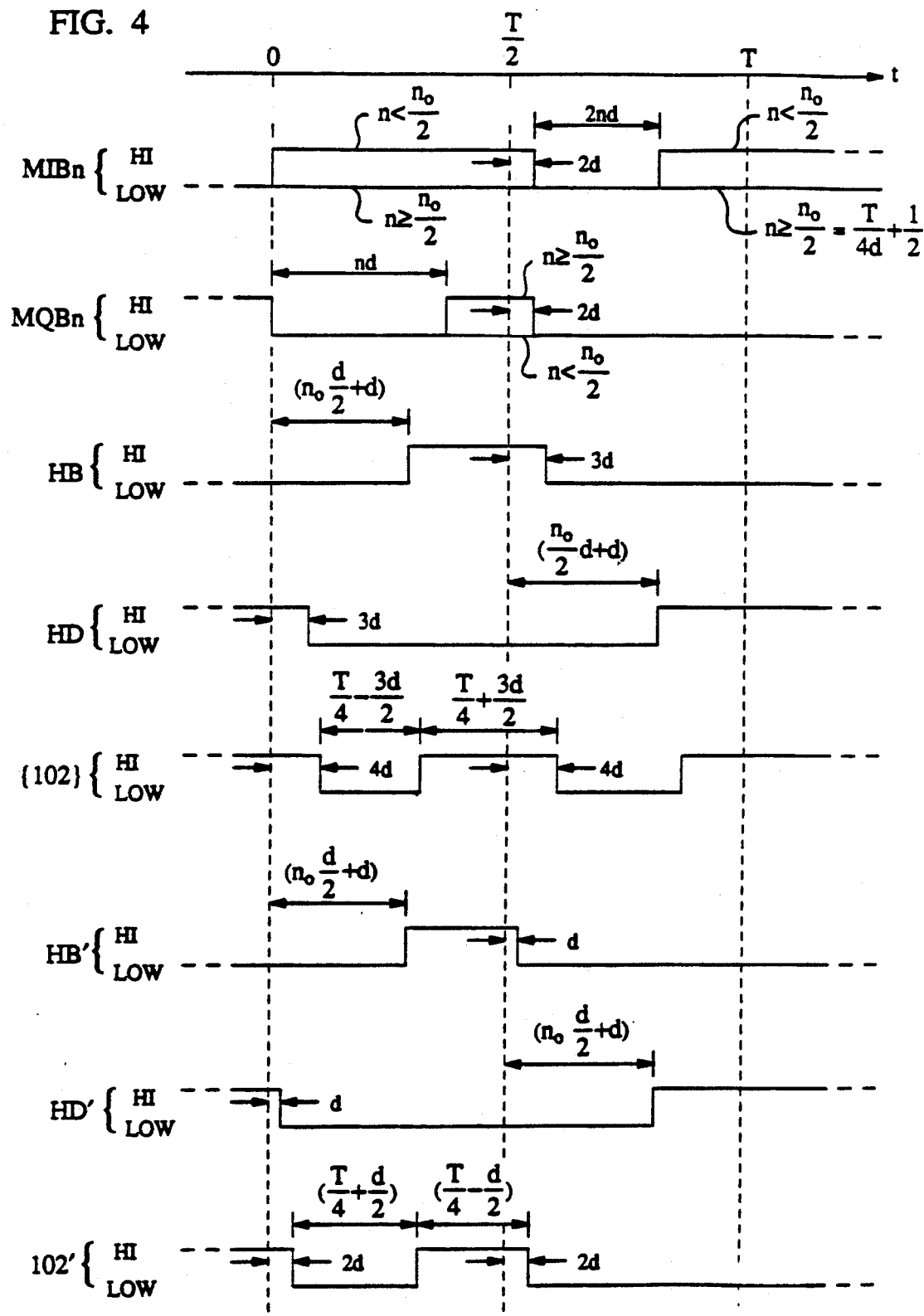

Referring now to FIG. 4, the signals delivered to terminals MIBn of the B boxes are the same as the signals developed at terminals MOA2n of the A boxes, because of the manner in which these terminals are connected together (FIGS. 1 and 2). Thus for $2n \geq n_o$, or $n \geq n_o/2$, all MIBn are always LOW and hence fully enable the NOR gates 11 (FIG. 1) in the B boxes to transmit the inverse of all IN signals delivered as inputs to these respective NOR gates 11. Consequently, for all $n \geq n_o/2$, the output MQBn of box Bn will be the same as the inverse of the input IN to this box Bn delayed by d, to wit, the inverse of the output OU of box B (n−1)—to wit, RA(n−1)—delayed by d. Thus, for $n \geq n_o/2$, MQBn and its inverse $\overline{\text{MQBn}}$ will have the profiles indicated in FIG. 4.

For all $n < n_o/2$, all MIBn=MOA2n=HI from $t=0$ to $t=T/2+2d$, whereby the NOR gates 11 in the B boxes have outputs MQn equal to LOW at least from $t=T/2+2d$. Moreover, these outputs MQn will remain LOW during the remaining time interval from $t=T/2+2d$ to $t=T$ because during this interval RA(n−1) is LOW.

Turning now to the output HB of inverter 26, note that the combination of this inverter 26 with NOR gate 25 is logically equivalent to an OR gate. Thus, this output HB will be the logical sum of all MQBn, delayed by d. Since the only MQBn that are not LO for all t are those for which $n \geq n_o/2$, and since all MQBn have the same right-hand (falling) edges at $t=T/2+2d$, the falling edge of HB will occur at $t=T/2+3d$. On the other hand, of all MQBn the earliest (left-hand) rising edge of the MQBn occurs for that MQBn for which $n=n_o/2$ (provided $n_o/2$ is an integer, otherwise n is the next largest integer), and hence the earliest rising edge of all MQn occurs at $t=(n_o/2)d$. Thus, the rising edge of HB will occur at $t=(n_o/2)d+d$. Similarly, the signal HD which is derived from row D, a row in which the clock CLK is T/2 out of phase with respect to the clock $\overline{\text{CLK}}$ delivered to row B, will have its falling edge at $t=3d$ and its rising edge at $(n_o+3)d$.

The signals HB and HD are delivered as inputs to the NOR gate 27. The output of NOR gate 27 is delivered as input to the inverter 30. Consequently, the output 102 of this inverter 30 is the logical OR of signals HB and HB, delayed by d, as indicated in FIG. 4. Note that this output 102 has two falling edges: one at $t=3d+d=4d$, derived from the falling edge of HD, and the other at $T/2+4d$, derived from the falling edge of HB; and two rising edges: one at $t=n_o\, d/2+2d$ and the other at $t=T/2\, n_od/2+2d$. The time interval between the first falling edge and the first rising edge in the signal 102 is thus equal to $(n_od/2+2d)-4d=n_od/2-2d=T/4-3d/2$. On the other hand, in the signal 102 the time interval between the first rising edge and the second falling edge is equal to $T/2+4d-(n_od/2+2d)=T/4+3d/2$. The signal 102 thus contains an inequality between LOW and HI intervals, but it otherwise is a desired signal having twice the frequency (one-half the period) of the clock input CLK.

Figure 5:
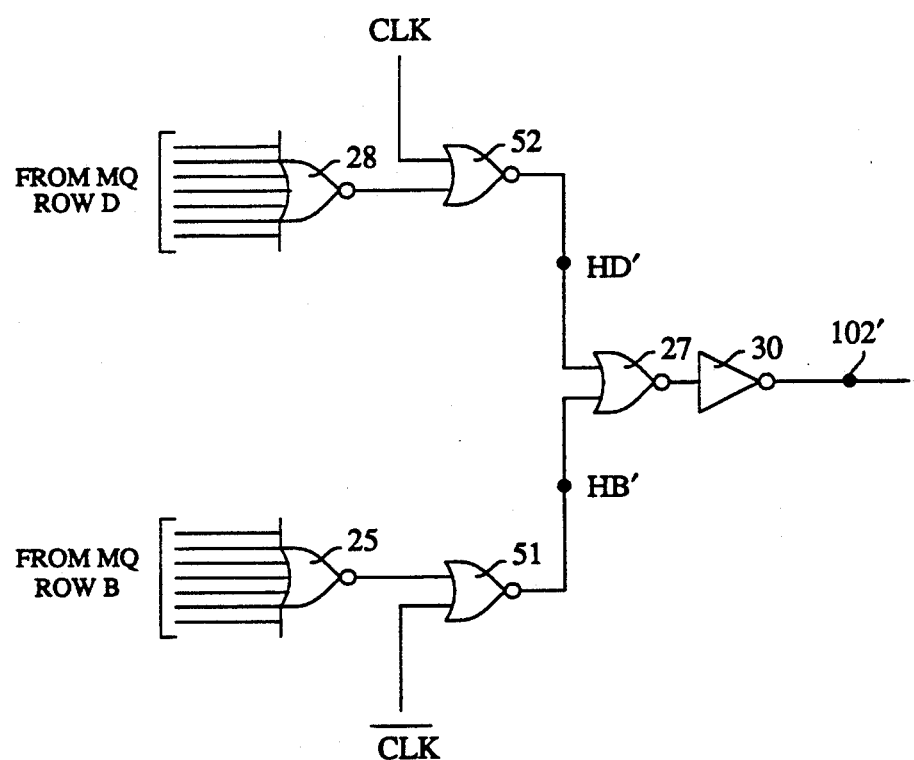
FIG. 5 is a logic diagram of a portion of the arrangement shown in FIG. 1, in accordance with a preferred embodiment thereof.

In order to reduce the inequality of HI vs. LOW intervals, the outputs $\overline{\text{HB}}$ and $\overline{\text{HD}}$ of the NOR gates 25 and 28 are delivered as inputs to separate NOR gates 51 and 52, respectively—all as indicated in FIG. 5. The NOR gate 51 also has an input $\overline{\text{CLK}}$; and the NOR gate 52 also has an input CLK. Outputs HB' and HD' of these NOR gates 51 and 52, respectively, will thus have their respective falling edges at $t=T/2+d$ and $t=d$ because of the HI values of $\overline{\text{CLK}}$ and CLK starting at $t=T/2$ and $t=0$, respectively. In this way, the LOW intervals in the output 102' of the inverter 30 become equal to $T/4+d/2$, and the HI intervals become equal to $T/4-d/2$.

Although the invention has been described in detail with reference to specific embodiments, various modifications can be made without departing from the scope of the invention. For example, instead of connecting the MO terminal of the 2n'th (n=running integer index=1, 2, 3, ...) one of the boxes in row A with the MI terminal of the corresponding n'th box in row B, the MO terminal of every 4n'th one of the boxes in row A (A4, A8, A12, ...) can be connected to the MI terminal of the corresponding 2n'th box in row B (B2, B4, B6, ...); and similarly for the connections of the MO terminals of the boxes in row B relative to the MI terminals of the boxes in row D. A frequency doubles obviously will still result.

Instead of connecting the MO terminals of A2, A4, A6, ..., respectively, to the MI terminals of B1, B2, B3, ..., these MO terminals of A2, A4, A6, ..., respectively, can be connected to the MI terminals of B2, B3, B4, ..., or to B3, B4, B5, ... —i.e., while any number of the MI terminals of the first B1, B2, ..., Bj, for reasonably small j, can be unconnected to any MO terminal of row A.

Instead of having only a single pair of MI and MQ terminals per box 10, a multiplicity of such pairs of terminals per box can be present, each connected to a separate NOR gate 11 whose other input is still the same IN. Such resulting added MI to MQ parallel paths, and hence added outputs HB—each from separate gates 28 and 29—are useful in cases where frequency multiplication other than doubling is desired. In such cases, it should first be recognized that if the MO terminal of ni'th box in row A is connected to the MI terminal of the nk'th box in row B, where i and k are fixed integers, then the output HB will have a rising edge located a space of time before $t=T/2$ which is equal to $T(i-k)/2i-d(i+k)/i$ or approximately $T(i-k)/2i$, that is, neglecting $d(i+k)/i$. Similarly, the output HD will have a rising edge located a space of time before $t=T$ which is also equal to approximately $T(i-k)/2i$. Thus, in particular, in case $i=3$, $k=1$, then the rising edge of HB will be located a space of time before $t=T/2$ which is approximately equal to $T/3$; and if $i=3$ and $k=2$, the rising edge of HB will be located a space of time before $t=T/2$ which is approximately equal to $T/6$. Similarly, the rising edges of HD will be located at points spaced from $t=T$ which are also approximately equal to $T/3$ and $T/6$, respectively. These edges, when combined through suitable logic devices, are useful for a frequency tripler. For example, with two separate MQ outputs per row B and per row D box one corresponding to $i=3$, $k=1$ and the other corresponding to $i=3$, $k=2$, there will be two separate outputs HB1 and HB2 from row B and two separate outputs HD1 and HD2 from row D, respectively; and these outputs should be combined through logic gates which produce the Boolean function $(HB1 \times HB2 + HB1 \times HB2)(HD1 \times HD2) + HB1 \times HB2 \times HD1 \times HD2$.

Moreover, the utilization means 202, or optionally another utilization means (not shown) can be connected to the output terminal of one of the NOR gates 25 or 28 or of the inverters 26 and 29. Also, the inverter 203 can be omitted while an inverter is inserted in each of the inputs to the C terminals of the boxes in row B.

Finally, the inverter 203 can be removed and inverters placed on the clock line of rows A and D, so that the clock pulse sequence CLK is delivered to row B and the complementary clock pulse sequence $\overline{\text{CLK}}$ to rows A and D, whereby the phase of the output 201 is shifted by one-half a period (viz., by a time interval T/2).

I claim:

1. A frequency multiplier circuit comprising:
  (a) a first cascaded chain (A1 A2 A3 ...) of clocked delay elements (12, 13), each such delay element having an intermediate node (R) and an output terminal (OU), and each having essentially the same time delay d in response to a change in an input applied thereto;
  (b) a first set of clocked latches (14, 15, 16 in e.g., A2, A4, A6, ...) the node (R) of the ni'th one of the clocked delay elements in the first chain (A1 A2 A3 ...) being connected to an input terminal of the n'th one of the clocked latches (14, 15, 16 in e.g., A2, A4, A6, ...) where n is a running integer and i is a fixed integer;
  (c) a second cascaded chain (B1 B2 B3 ...) of clocked delay elements (12, 13), each having an intermediate node (R) and an output terminal (OU) and having the same time delay d in response to a change in an input applied thereto;
  (d) a first set of logic gates (11 in B1, B2, B3, ...), the nk'th one of each having one input terminal (MI) thereof connected to an output terminal (MO) of the n'th one of the clocked latches in the first set of latches (14, 15, 16 in e.g., A2, A4, A6, ...), and the n'th one of each having another input terminal connected to the output terminal (OU) of the (n−1)'th one of the clocked delay elements (12 and 13 in B1 B2 B3 ...) in the second cascaded chain;
(e) a first multiple input logic gate (25); and
(f) means for connecting an output terminal of each of the logic gates (11) in the first set thereof to a separate one of the input terminals of the multiple input logic gate (25).

2. The circuit of claim 1 and a utilization device connected to an output terminal of the multiple input logic gate (25).

3. The circuit of claim 1 further comprising:
(a) a second set of clocked latches (14, 15, 16 in e.g., B2, B4, B6, ...), a node (R) of the ni'th one of the clocked delay elements (12, 13) in the second cascaded chain (B1 B2 B3 ...) being connected to an input terminal of the n'th one of the clocked latches (14, 15, 16 in e.g., B2, B4, B6, ...) of the second set of latches;
(b) a third cascaded chain (D1 D2 D3 ...) of clocked delay elements (12, 13), each having an intermediate node (R) and an output terminal (OU), and each having essentially the same time delay d in response to a change in an input thereto;
(c) a second set of logic gates (11 in D1, D2, D3, ...), the nk'th one of each having one input terminal (MI) thereof connected to an output terminal of the n'th one of the clocked latches in the second set of latches (14, 15, 16 in e.g., B1, B2, B3, ...), and the n'th one of each another input terminal thereof (IN) connected to the output terminal (OU) of the (n−1)'th clocked delay elements (12, 13) in the third chain (D1 D2 D3 ...);
(d) a second multiple input logic gate (28);
(e) means for connecting an output terminal of each of the logic gates (11) in the second set (in D1, D2, D3, ...) to a separate one of the input terminals of the second multiple input logic gate (28); and
(f) means for connecting an output terminal of the first and second multiple input logic gates (25 and 28) to an output logic element (27).

4. In combination:
the circuit of claim 3 and a utilization device connected to an output terminal of the output logic element (27) of the circuit.

5. The circuit of claim 3 in which the latches in the first set are clocked with a first clock pulse sequence (CLK) and the latches in the second set are clocked with a second clock pulse sequence ($\overline{CLK}$) that is complementary to the first sequence, and in which the outputs of each of the first and second multiple input logic gates (25) are respectively fed to an input terminal of first and second auxiliary output logic gates (51, 52) each respectively having another input terminal connected to the second and first clock pulse sequences, respectively.

6. The circuit of claim 3 in which each clocked delay element (12, 13) consists essentially of a two-input NOR gate (12) which feds an inverter (13), and in which one of the inputs to each such NOR gate is a clock pulse sequence (CLK), or its complement ($\overline{CLK}$), having a frequency which is to be doubled by the circuit.

7. A frequency doubler circuit in accordance with claim 1 in which i=1 and k=2.

8. In combination:
the circuit of claim 3 and a utilization means connected to an output terminal of the output logic element (27).

9. The circuit of claim 1 in which each clocked delay element (12, 13) consists essentially of a two-input NOR gate (12) which feds an inverter (13), and in which one of the inputs to each such NOR gate is a clock pulse sequence (CLK), or its complement ($\overline{CLK}$), having a frequency which is to be doubled by the circuit.

10. The circuit of claim 1 in which each of the logic gates (11) in the first set consists essentially of a two-input NOR gate.

11. A signal frequency multiplier circuit for doubling the frequency of an input signal comprising:
(a) a source of the input signal frequency to be doubled;
(b) a first set of logic networks (12, 13) arranged in a first chain (A1, A2, A3, ...) in which each of the logic networks in the first set has one input terminal (C) connected to the source of the input signal (CLK) frequency is to be doubled and in which each of the logic networks in the first chain, except for an initial one (A1) of the first chain, has another input terminal (IN) connected to an output terminal (OU) of the immediately preceding logic network in the first chain, each logic network (12, 13) having essentially the same response time delay (d);
(c) a first set of clocked bistable latches (14, 15, 16 in e.g., A2, A4, A6, ...) each having one input terminal connected to the source of the input signal (CLK), a node (R) of the 2n'th one of the logic networks in the first set (12, 13 in e.g., A2, A4, A6, ...) being connected to another input terminal of the n'th one of the clocked bistable latches (14, 15, and 16 in e.g., A2, A4, A6, ...) where n is a running integer or a fixed multiple thereof,
(d) a second set of logic networks (12, 13) arranged in a second chain (B1, B2, B3, ...) each of the logic networks in the second chain having one input terminal connected to the source of the input signal ($\overline{CLK}$) whose frequency is to be doubled, and in which each of the second logic networks, except for an initial one thereof, has another input terminal connected to an output terminal of the immediately preceding logic network in the second chain, and each such logic network (12, 13) in the second set having essentially the same response time delay (d);
(e) a first set of logic gates (11 in B1, B2, B3, ...) each having one input terminal (MI) connected to an output terminal (MO) of a separate one the clocked bistable latches (14, 15, 16 in A2, A4, A6, ...) and another input terminal (IN) connected to the output terminal (OU) of a separate one of the logic networks (12, 13) in the second chain (B1, B2, B3, ...)
(f) a multiple input logic gate (25) and
(g) means for connecting an output terminal of each of the logic gates (11) to a separate one of the input terminals of the multiple input logic gate (25).

12. The circuit of claim 11 in which each of the logic networks (12, 13) consists essentially of a two-input NOR gate which feeds an inverter.

13. The circuit of claim 11 in which the response time delays (d) in all the logic networks of the first and second sets are essentially equal.

14. The circuit of claim 11 in which each of the logic gates (11) consists essentially of a two-input NOR gate.

15. The circuit of claim 11 further comprising
(a) a second set of bistable latches (14, 15, 16 in e.g., B2, B4, B6, ...), each having one input terminal connected to the source of the input signal (CLK), a node (R) of the 2n'th one of the logic networks (12, 13) in the second set (e.g., in B2, B4, B6, ...) being connected to another input terminal of the n'th one of the bistable latches in the second set of latches, where n is the running integer or a fixed multiple thereof;

(b) third set of logic networks (12, 13) arranged in a third chain (D1, D2, D3, ...) in which each of the logic networks in the third set has one input terminal connected to the source of the input signal whose frequency is to be doubled, and in which each of the third logic networks, except for an initial one thereof, has another input terminal connected to an output terminal of the immediately preceding logic network in the second chain;

(c) a second set of logic gates (11 in D1, D2, D3, ...) each of which has one input terminal thereof (MI) connected to an output terminal (MO) of a separate one of the bistable latches in the second set of latches (14, 15, 16 in e.g., B2, B4, B6, ...) and another input terminal thereof (IN) connected to the output terminal (OU) of a separate one of the logic networks (12, 13) in the third set;

(d) a second multiple input logic gate (28);

(e) means for connecting an output terminal of each of the logic gates in the second set to a separate one of the input terminals of the second multiple input logic gate (28); and (f) means for connecting an output terminal of each of the multiple input logic gates to an output logic element (27, 30).

16. A combination of the circuit of claim 15 and a utilization device connected to an output terminal of the output logic element (27, 30) of the circuit.

17. The circuit of claim 15 in which the output logic element is a NOR gate which feeds an inverter.

18. The circuit of claim 15 in which the multiple input logic gate (25) comprises a multiple input NOR gate (25) which feeds an inverter.

19. The circuit of claim 11 in which each of the logic networks in the first and second sets thereof consist essentially of a two-input NOR gate (12) which feeds an inverter (13).

20. The circuit of claim 11 in which each of the logic gates (11) is essentially a two-input NOR gate.

* * * * *